US005977552A

United States Patent [19]

Foad

[11] Patent Number: 5,977,552

[45] Date of Patent: Nov. 2, 1999

[54] BORON ION SOURCES FOR ION IMPLANTATION APPARATUS

[75] Inventor: Majeed A. Foad, West Sussex, United Kingdom

[73] Assignee: Applied Materials, Inc., Santa Clara, Calif.

[21] Appl. No.: 08/990,323

[22] Filed: Dec. 11, 1997

Related U.S. Application Data

[63] Continuation-in-part of application No. 08/758,135, Nov. 25, 1996, abandoned.

[30] Foreign Application Priority Data

Nov. 25, 1995 [GB] United Kingdom .................. 9524117

[51] Int. Cl.[6] ........................... H01J 37/317; H01J 37/08

[52] U.S. Cl. ................................ 250/492.21; 250/423 R; 250/424; 250/425

[58] Field of Search .......................... 250/492.21, 423 R, 250/424, 425

[56] References Cited

U.S. PATENT DOCUMENTS

| | | | |
|---|---|---|---|
| 2,842,466 | 7/1958 | Moyer | 438/514 |
| 3,960,505 | 6/1976 | Beck et al. | 250/492.21 |

FOREIGN PATENT DOCUMENTS

| | | |
|---|---|---|
| 1442586 | 7/1976 | United Kingdom . |
| WO9323869 | 11/1993 | WIPO . |

*Primary Examiner*—Jack I. Berman
*Attorney, Agent, or Firm*—Boult Wade Tennant

[57] ABSTRACT

In an efficient ion source $BF_3$ gas is first passed over solid boron heated in an oven to at least 1100° C. to reduce the $BF_3$ to BF molecules. It is also proposed to use solid boron as feed stock by heating this in an oven to at least 1800° C. to produce boron vapour. Either a reactive gas such as fluorine or an inert gas such as Argon is also introduced into the arc chamber to react with or sputter off boron condensing on the arc chamber walls.

27 Claims, 5 Drawing Sheets

BORON ION SOURCES FOR ION IMPLANTATION APPARATUS

This application is a continuation-in-part of application Ser. No. 08/758,135 filed on Nov. 25, 1996, now abandoned, the entire contents of which are hereby incorporated by reference.

FIELD OF THE INVENTION

The present invention is concerned with ion implantation apparatus and particularly with boron ion sources for such apparatus.

BACKGROUND OF THE INVENTION

In the manufacture of semiconductor devices and integrated circuits it is necessary to modify the semiconductor substrate material (particularly silicon) by diffusing or implanting therein atoms or molecules of selected dopants to produce regions in the semiconductor substrate of selected varying conductivity and having majority charge carriers of different polarities. Typical dopant materials used in this process are boron, phosphorus, arsenic and antimony.

Doping the semiconductor substrate using ion implantation has become increasingly important with the continuing reduction in feature sizes on integrated circuit structures.

When implantation apparatus is arranged to implant boron ions, the standard prior art arrangement for generating these ions is to feed boron trifluoride ($BF_3$) gas as a feedstock into an arc chamber. In the arc chamber, a plasma is produced in which the $BF_3$ molecules are cracked and ionised to produce $B^+$, $BF^+$ and $BF_2^+$ ions. These ions are extracted from the arc chamber and accelerated to a predetermined energy at which they are passed through a mass selection arrangement. The mass selection arrangement typically comprises a magnetic field in which the radius of curvature of the flight path of the ions from the source will be dependent upon the mass/charge ratio of the individual ions. A mass selection slit at the exit of the magnetic field region allows ions of a selected mass/charge ratio to pass through to the target substrate.

Prior to implantation, the semiconductor substrate i.e. typically a silicon or gallium arsenide wafer, is prepared with a required pattern of photoresist, so that the ions will be implanted only in selected regions of the wafer as required. The depth to which ions are implanted in the wafer is dependent upon the energy of the ions as they impinge upon the wafer surface. With the increasing demand for smaller and faster semiconductor devices, there is an increasing need for the production of very shallow structures in the wafer requiring the use of ions of relatively low energy at the point of implantation.

On the other hand, there is still a need for the flux of ions impinging upon the wafer (at the desirable low energies) to be as high as possible, implying a relatively high beam current density of the ions. This is required in order to provide high wafer processing speeds.

The requirements of high ionic beam current density and low energy at the point of implantation are conflicting. With very low implant energies, it becomes increasingly difficult to control the ion beam and avoid a substantial loss of ions from the beam, for example because of dissipation through space charge effects.

In prior art boron ion sources the ion current extracted from the source is directly proportional to the extraction energy up to a saturation energy of about 40 keV. For implantation energies below 10 keV, it has been proposed to extract ions from the source at 10 keV or higher and then decelerate the ions further down the beam line before the ions impinge upon the target. However, even when operating the implantation apparatus with the ion source at saturation extraction energy, the net current of mass selected, ions impinging upon the wafer may be less than desirable.

It should be understood here that when using $BF_3$ as the feedstock gas for the ion source, not only $B^+$ ions but also $BF_2^+$, $BF^+$, and $F^+$ are produced in the source and duly extracted. The mass selection arrangement ensures only the desired ions, usually $B^+$, are fed onto the target, so that the part of the extracted beam current represented by the non-desired ions is lost. In general, there is a need to maximise the beam current impinging on the wafer at all implantation energies.

Boron halides, in particular $BF_3$, are very poisonous and United Kingdom Patent No. 1442586 discloses the use of boron oxide as an alternative non-poisonous feed material for boron ion sources. However, the presence of oxygen in the ion source is highly undesirable as it severely limits cathode life. This United Kingdom patent also states that elemental boron is unsuitable as a feed stock since it provides insufficient vapour pressure at conventional oven temperatures.

International Patent Publication WO93/23869 discloses the use of boron powder in a special arrangement of ion source in which the boron powder is directly exposed to the plasma in the arc chamber. The boron powder is biased more negatively than the cathode in the source to promote an intense secondary discharge at the surface of the boron powder. In addition $BF_3$ gas is bled through the powder into the arc chamber. The International Publication teaches that the use of boron vapour from elemental boron in a conventional arc chamber is not suitable as the arc chamber itself then has to be maintained at about 2000° C. to prevent condensation of boron on the walls of the arc chamber.

SUMMARY OF THE INVENTION

According to one aspect of the present invention, an ion implantation apparatus includes an ion source comprising an arc chamber, a source of feed gas to the arc chamber, and means to generate a plasma in the arc chamber, the plasma containing ions desired for implantation, the source of feed gas comprising a closed oven containing solid boron and operable to heat the solid boron to at least 1100° C., a source of $BF_3$ gas, an inlet connection to supply $BF_3$ gas from said source to said closed oven to contact the solid boron in the oven and an outlet connection to supply gas from the closed oven to the arc chamber, said outlet connection including a gas passage from the closed oven to the arc chamber.

Contrary to the assertions of the prior art, it has been found that substantial advantages can be obtained using a closed oven, which is separate from and external to the arc chamber, to contain solid boron over or through which $BF_3$ gas is passed to feed the arc chamber.

It has been observed that passing $BF_3$ gas over solid boron heated to temperatures preferably above 1300° C. produces the reaction:

$$BF_3(gas)+2B(solid)\rightarrow 3BF(gas).$$

See, for example, "The heat and entropy of formation of boron (I) fluoride (g)", by Blauer et al, J. Phys. Chem., 68, 2332 (1964).

In this aspect of the invention, this observed reaction is used to increase the proportion of boron monofluoride (BF)

present in the arc chamber. It is then believed that this BF gas will more readily be cracked and ionised to produce $B^+$ ions in the arc chamber, thereby increasing the proportion of $B^+$ ions in the ion stream extracted from the chamber. In addition, each reaction of a $BF_3$ molecule as above results in three boron atoms (3BF) where there was only one. Thus, the ratio of boron to fluorine atoms in the gas introduced to the plasma in the arc chamber is increased. This ratio can reach 1:1 if the reaction is 100% efficient with all $BF_3$ converted to BF. The efficiency of the reaction is a function of oven temperature and the surface area of boron solid in the oven.

Preferably, the oven is operable to heat the solid boron to a temperature in the range 1500–1800° C.

The solid boron in the oven may be in particulate form, whereupon the arc chamber has a feed gas inlet aperture and the oven may comprise a generally tubular crucible which is open at one end containing said boron powder, and an interface component to seal said open end of the crucible to said feed gas inlet aperture to provide said outlet connection, said inlet connection comprising a tube of refractory material feeding through the interface component from outside the oven and the arc chamber and extending inside the crucible to the closed end thereof.

Alternatively, the solid boron may be in rigid form at least partially lining the interior of the oven. Indeed, the oven may have an internal lining formed of solid boron.

In a preferred embodiment, the oven comprises a tubular element formed of solid boron, a heater to heat the tubular element, said inlet connection providing a gas-type connection to one end of said tubular element and an interface component to seal the other end of the tubular element to the feed gas inlet aperture of the arc chamber to provide said outlet connection. The tubular element may comprise a plurality of passages in parallel.

In another arrangement the solid boron is formed as a porous block having opposite ends and the inlet connection is arranged to deliver $BF_3$ gas to one end of the block and the outlet connection is arranged to supply gas from the other end of the block.

When solid boron is used, it may be provided as substantially pure boron in a self-supporting solid mass. Alternatively, the solid boron may be held in a self-supporting solid mass by an inert binder.

The present invention also contemplates a method of generating boron ions for implantation in an ion implantation apparatus, comprising heating a mass of solid boron in a closed oven to at least 1100° C., supplying $BF_3$ gas to the closed oven to contact the hot solid boron to react therewith to produce gas containing BF molecules, feeding the gas containing BF molecules from the closed oven along a gas passage to an arc chamber, generating a plasma in the arc chamber to dissociate and ionise the BF molecules to produce $B^+$ ions and extracting the ions from the arc chamber for implantation. Preferably the solid boron is heated to between 1500° and 1800° C.

In another aspect of the present invention, an ion implantation apparatus includes an ion source comprising an arc chamber, a source of feed gas for the arc chamber, and means to generate a plasma in the arc chamber, the plasma containing ions desired for implantation, the source of feed gas comprising a closed oven containing solid boron and operable to heat the solid boron to at least 1800° C. to produce boron vapour, an outlet connection to supply said boron vapour from the closed oven to the arc chamber, said outlet connection including a gas passage from the closed oven to the arc chamber, the arc chamber having walls at a temperature below the 1800° C. so that boron vapour in the arc chamber may condense on to said walls, the apparatus including a source of reactive gas, and means to feed said reactive gas from said source of reactive gas to the arc chamber, said reactive gas being selected to react with boron molecules condensing on to the walls of the arc chamber. The reactive gas may be fluorine containing.

Instead of a source of reactive gas, the apparatus may have a source of inert gas, and means to feed said inert gas from said source of inert gas to the arc chamber, said inert gas being selected to increase sputter etching of said walls of the arc chamber to remove boron condensed thereon. The inert gas may be argon. The oven may in these arrangements be operable to heat the solid boron to between 2000 and 2200° C.

The problem of elemental boron condensing on the walls of the arc chamber is avoided by ensuring adequate reactive gas, typically fluorine containing, or inert gas, typically argon, in the arc chamber. In the case of fluorine containing reactive gas, the plasma produces fluorine molecules which will aggressively react with any boron condensing on the arc chamber walls. In the case of argon, for example, additional plasma energy is produced which will increase the sputter etching of any boron on the arc chamber walls.

The invention also contemplates a method of generating boron ions for implantation in an ion implantation apparatus, comprising heating a mass of solid boron in a closed oven to at least 1800° C. to produce boron vapour at a vapour pressure sufficient to support a plasma, feeding the boron vapour from the closed oven along a gas passage to an arc chamber, generating a plasma in the arc chamber to produce $B^+$ ions maintaining the walls of the arc chamber at below 1800° C. so that boron vapour may condense on to said walls, feeding a selected reactive gas to the arc chamber to react with boron molecules condensed on to said walls, and extracting $B^+$ ions from the arc chamber for implantation. Instead of a reactive gas, a selected inert gas can be fed to the arc chamber to increase sputter etching of said walls of the arc chamber to remove condensed boron thereon.

Heating solid boron to a temperature of 1800° C. produces a partial pressure of boron vapour of about $10^{-4}$ torr which is the minimum pressure which can support a plasma in some ion sources, particularly the Bernas ion source which will be described later herein.

It can be seen that the above aspects of the present invention are all concerned with providing a feedstock gas in the arc chamber of the ion source which is more readily cracked (if necessary) and ionised in the ion source to produce $B^+$ ions, thereby increasing the proportion of these $B^+$ ions in the ion current extracted from the source.

Examples of the invention will now be described with reference to the accompanying drawings.

DETAILED DESCRIPTION OF THE PREFERRED EMBODIMENTS

Figure 1:
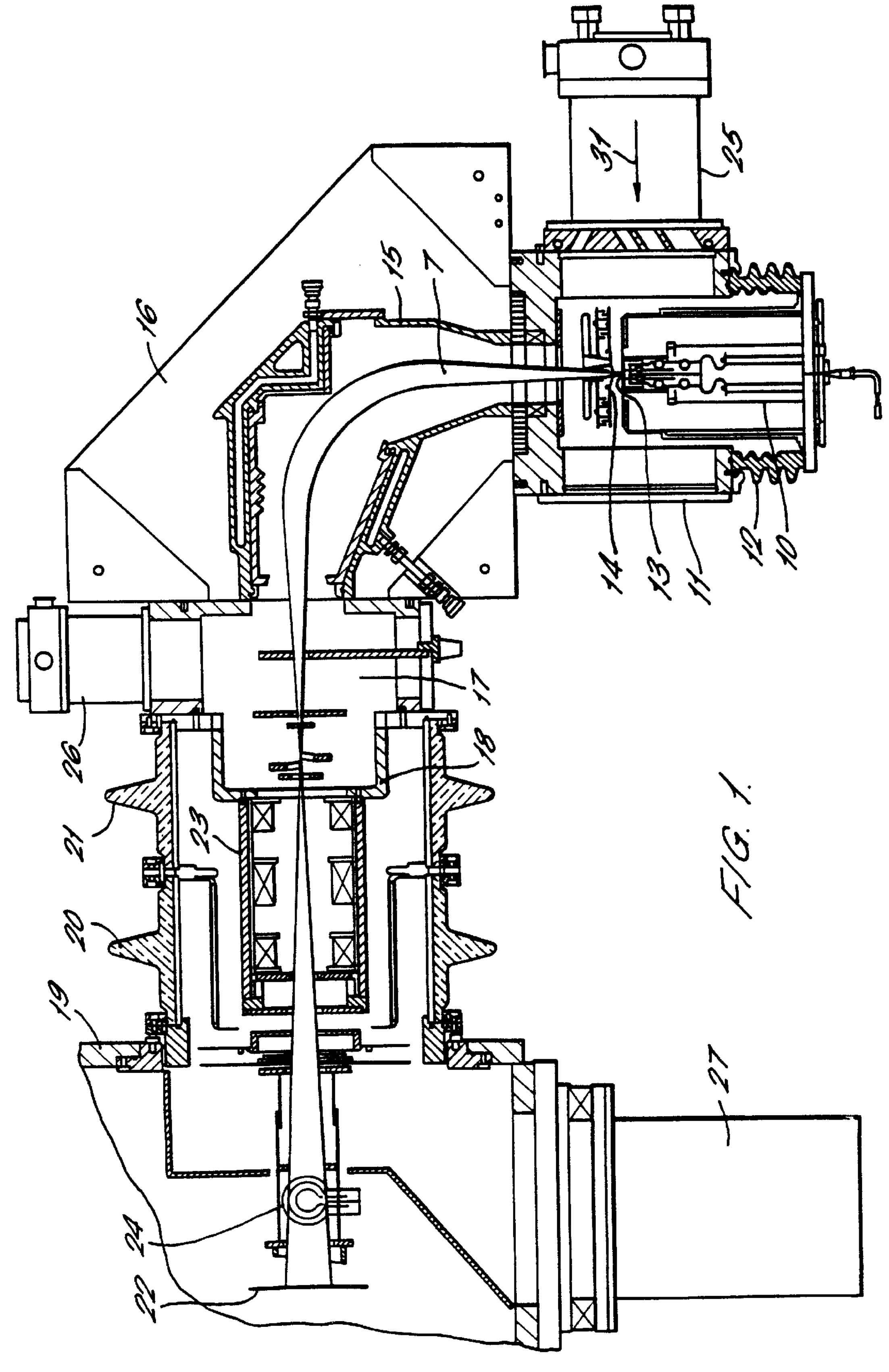
FIG. 1 is a schematic diagram of an ion implantation apparatus which may incorporate a modified ion source so as to embody the present invention.

Referring to FIG. 1, implantation apparatus is illustrated schematically. In the apparatus, ions for implanting are generated in an ion source 10. The ion source illustrated is a Bernas ion source which will be described in more detail below with reference to FIG. 2. The ion source is mounted on a housing 11 by means of an insulating bushing 12, so that the ion source can be biased relative to the housing to generate the required extraction potential to extract ions from the source and accelerate them to the required transport energy of the ion beam. Ions are extracted from the source through a slit 13 and accelerated to the required transport energy by the potential difference between the slot and one or more extraction electrodes illustrated generally at 14.

Ions extracted from the ion source then pass from the ion source housing 11 into the flight tube 15 of an analysing magnet 16. In the analysing magnet 16, the ions in the beam 7 from the source travel through a region of strong magnetic field causing the ions to adopt flight paths having radii of curvature dependent on the mass/charge ratio of the individual ions.

Ions of a predetermined range of mass/charge ratios travel through the analysing magnet in curves to emerge substantially at right-angles to the original beam path, into a mass selecting region 17 containing one or more slits to define precisely the mass/charge ratio selected by the apparatus for implanting.

In the form of ion implanter illustrated, the ions may be extracted from the ion source 10 and accelerated to energies of about 10 keV or higher. The ions are retained at this energy throughout their passage through the analysing magnet and the mass selection region 17. For this purpose, the flight tube 15 of the analysing magnet, the housing 18 of the mass selection region and the housing 11 are maintained at uniform potential. The Bernas ion source 10 is biased at 10 kV relative to this flight tube ground potential, to generate the required extraction bias.

In a practical implanter, implantation energies of up to 200 keV or more may be required, so that it is necessary to accelerate the ions (still at a maximum 40 keV) leaving the mass selection region 17 to the higher required implantation energy. For this purpose, housing 19, containing the semiconductor wafer to be implanted is insulated from the housing 18 by means of insulating bushings 20 and 21. Wafer 22 to be implanted is mounted on a holder in the housing 19, and the whole target region including housing 19 and wafer holder is held at ground potential. The housing 18 is then biased as required relative to the target housing 19 to provide the required acceleration potential to accelerate the mass selected ions to the required implantation energy.

During the passage of the ion beam through the insulating bushings 20 and 21, the beam is focused in a focusing tube 23 providing a quadrupole magnetic focusing field.

Immediately before the accelerated beam impinges upon the wafer 22, a plasma gun 24, floods the beam and the wafer with low energy electrons to neutralise any charge accumulation on the surface of the wafer due to implanted ions.

It will be appreciated that the entire beam line is maintained at very low pressure. Turbo pumps 25 and 26 are provided to evacuate the ion source and the mass selection region respectively. A further cryogenic pump 27 maintains the pressure in the target region as low as possible to minimise contamination. As explained previously, the ions provided from the ion source 10 may be those of a number of substances required as dopants in the substrate material of the wafer. A common dopant is boron and in the prior art boron ions are produced by feeding $BF_3$ gas to the ion source in which the gas is cracked and ionised to produce not only $B^+$ ions but also $BF^+$, $BF_2^+$ and $F^+$. The beam extracted from the ion source 10 includes all these ions created in the ion source as well as further contaminant ions, including ions of tungsten. The analysing magnet 16 and mass selection region 17 functions to select only a desired ion specie from the ions extracted from the source, so that downstream of the mass selection slits in the unit 17, the continuing ion beam comprises substantially only the desired ions, usually $B^+$, but sometimes $BF_2^+$.

Although the described apparatus is capable of further accelerating the ions after mass selection by as much as 160 keV for implantation, the apparatus can also operate with lower implantation energies. Indeed, by biasing the target region in the opposite direction, the mass selected beam can be decelerated to below the ion source extraction energy.

Figure 2:
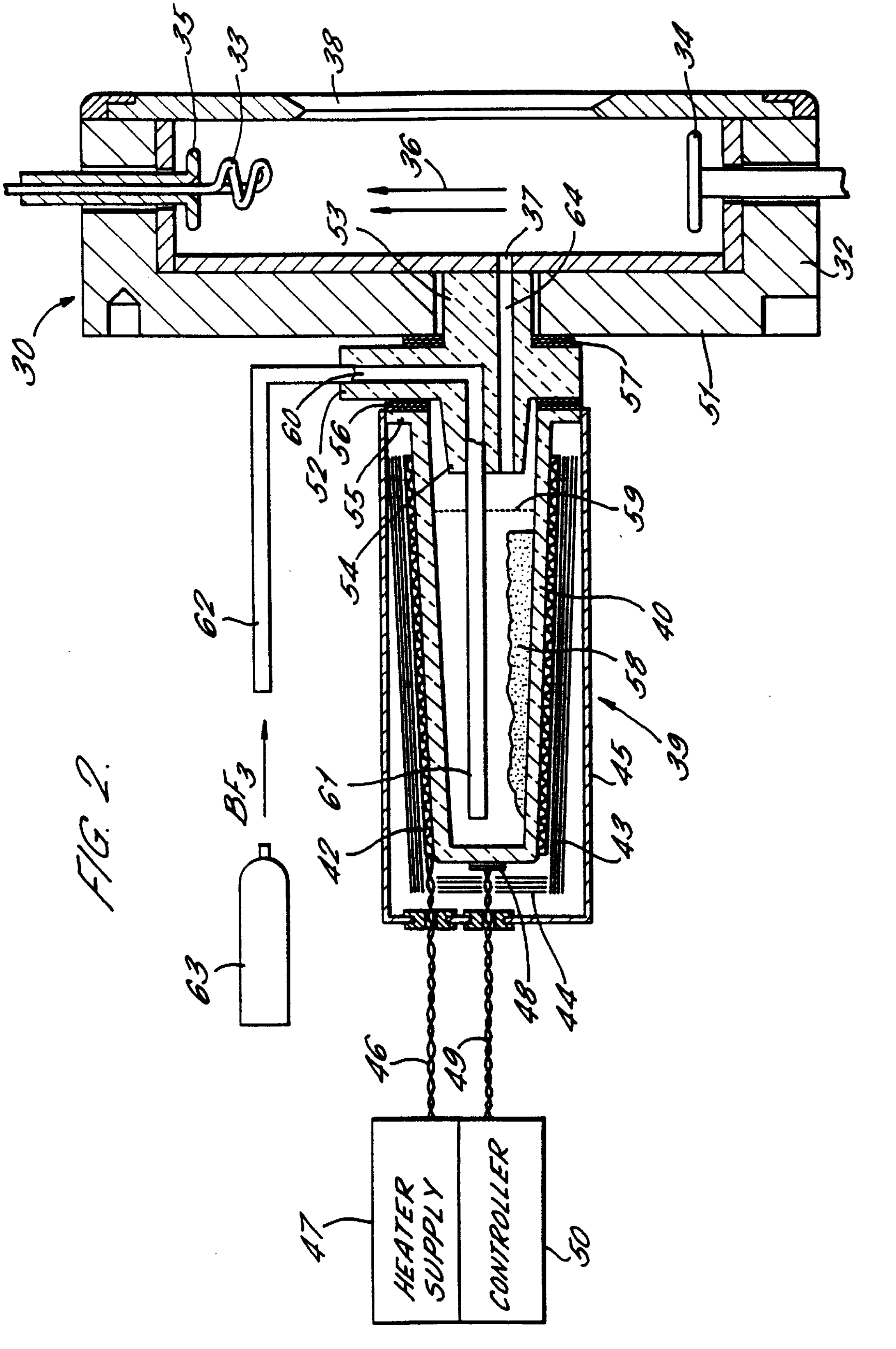
FIG. 2 is a schematic diagram in cross-section illustrating a modified ion source for use in the apparatus of FIG. 1 which includes an oven for producing BF gas from $BF_3$ feed gas.

The processing speed for wafers exposed to the beam of ions for implantation is dependent amongst other things on the beam current density of required ions impinging upon the wafer. Especially for low implantation energy applications, there are difficulties in maintaining the beam current of ions being implanted at satisfactory levels. Referring to FIG. 2, there is shown a modified form of ion source for use with the apparatus of FIG. 1 which can increase the proportion of the desired ions in the beam current extracted from the source, so that the residual beam current of the desired ions implanted in the wafer can also be increased.

Referring to FIG. 2, this illustrates in cross-section the Bernas ion source 30, seen from one side in the drawing of FIG. 1 in the direction of arrow 31. The ion source 30 comprises an arc chamber 32 containing a filament 33 at one end forming a cathode and a counter-cathode 34 at the other end. An additional reflector 35 is located between the filament 33 and the upper end of the chamber.

In operation, the filament 33 is heated by a current to emit thermal electrons and the cathode filament 33 together with both the counter cathode 34 and the reflector 35 are biased at a substantial negative potential relative to the housing 32. The emitted electrons are accelerated by the bias field and constrained to travel in helical paths between the filament 33 and the counter-cathode 34 by a magnetic field 36 extending between the filament and the counter-cathode 34.

Gas supplied into the arc chamber of the ion source through an inlet 37 is dissociated and/or ionised by the electrons forming a plasma of charged particles. The positively charged ions are extracted from the arc chamber through a slit 38 by an extraction potential between the arc chamber and an extraction electrode (not shown).

In this modified example of ion source, embodying the present invention, an oven arrangement 39 is mounted on the housing 32 of the arc chamber. The oven 39 comprises an inner refractory metal lined graphite crucible 40 of generally tubular shape which is open at one end 41. A heating element 42 surrounds the cylindrical (or frustoconical as shown in the drawing) outer surfaces of the crucible 40. The heating element 42 may be formed of tungsten wire, say 1 mm diameter, wrapped around the crucible in a zig-zag fashion along the axis. The wire may be electrically insulated by ceramic tubes or beads in manners known for high temperature heating elements of this kind.

It is important to ensure that the heating element can operate to heat the crucible 40 to the temperatures desired, in the present case as much as 1800° C.

Instead of tungsten wire, the heating element may be formed out of a tungsten foil wrapped around the crucible, or alternatively may be formed of CVD grown graphite.

Around the heating element 42, a heat shield 43 is formed of a number of layers of foil, typically tantalum (Ta), e.g. 0.2 mm thick. Satisfactory results may be obtained with 7 such layers. The heat shield may comprise layers of the foil wound around the tubular form of the crucible and heating element, in combination with discs 44 of the foil providing the heat shield at the closed end of the crucible.

In addition, one or two layers of tantalum foil may be provided between the heating element 42 and the outside surface of the crucible 40 so as to improve the uniformity of heat applied over the surface of the crucible by the heating element.

The crucible with heating element and heat shield is then contained within an external casing 45 which may also be formed of tantalum, typically 0.5–0.8 mm thick. Lead wires 46 for the heating element 42 are fed through the inner heat shielding 43 and via lead-throughs also through the outer casing 45, to a heater supply 47.

In order to control the temperature of the crucible 40, a high temperature measuring device 48, such as a thermocouple, is located in intimate thermal contact with the outer surface of the crucible. Lead-out wires 49 connect the thermocouple 48 to a controller 50 which controls the current supplied by the heater supply 47 to maintain the temperature of the crucible as required. The thermocouple may be Tungsten 5% Rhenium/Tungsten 26% Rhenium. The controller 50 may be a closed loop type such as available from Eurotherm. The heater supply 47 may be a stable DC power supply, e.g. 75 V at 18 A.

At the open end of the crucible 40, the right-hand end in FIG. 2, the oven assembly 39 is coupled securely to a wall 51 of the arc chamber via a graphite interface component 52. The interface component 52 includes a parallel nipple 53 on one side which fits in a corresponding hole in the wall 51 of the arc chamber of the ion source. On the other side of the interface unit 52, a tapered nipple 54 fits inside the open end 41 of the crucible 40. The crucible 40 has an outwardly extending flange 55 at its open end 41, providing an annular sealing face for sealing against the interface component 52.

The gas seal between the interface component 52 and the flange 55 is improved by the use of multiple layers 56 of thin washers made of flexible graphite gasket material. Similarly, the seal between the interface unit 52 and the wall 51 of the arc chamber is improved by layers 57 of thin washers also of the flexible graphite gasket material.

Inside the crucible 40, there is contained a mass of loose boron powder or granules 58, extending substantially from the closed end of the crucible up to a porous retaining grid 59. The interface unit 52 includes a first bore 60 extending from an inner face of the tapered nipple 54, initially parallel to the axis of the interface unit and then turning through a right-angle to emerge at an outer face of the interface unit between the oven assembly and the arc chamber. A length of ceramic tube 61 extends from the inner end of the bore 60 up to close to the closed end of the crucible 40. A further length of ceramic tube 62 connects the outer end of the bore 60 to a supply 63 of boron trifluoride gas.

A second bore 64 extends axially through the interface unit 52 from the inner face of the tapered nipple 54 to the face of the parallel nipple 53, thereby connecting the inside of the oven to the inside of the arc chamber at the inlet 37.

In operation, the oven 39 is operated to heat the crucible and the boron powder 58 contained therein to a temperature of typically 1500° C. or more. $BF_3$ gas is supplied along the pipe 62 so as to flow into the oven at the closed end of the crucible from the pipe 61. As the $BF_3$ gas passes over the boron granules or powder 58, it reacts with the solid boron to produce a fraction of boron monofluoride gas (BF). The resulting gas including BF then passes through the bore 64 into the arc chamber 30, where the BF gas is cracked and ionised to produce $B^+$ ions.

Because it takes far less energy to create $B^+$ ions from BF gas than from $BF_3$ gas, the proportion of $B^+$ ions produced in the plasma in the arc chamber is much increased. As a result, the ions extracted from the arc chamber in the implantation apparatus have a higher proportion of $B^+$ ions, so that after mass selection, the beam current implanted on the target substrate is correspondingly higher.

Figure 3:
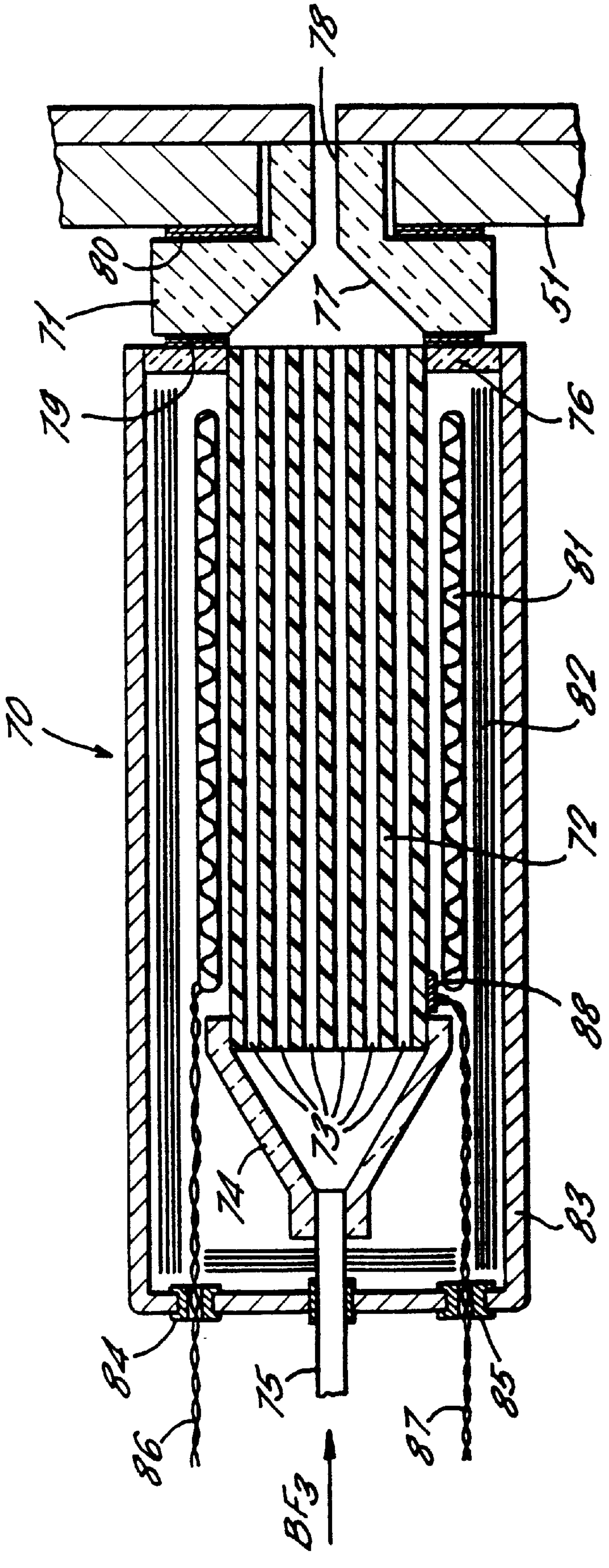
FIG. 3 is a schematic diagram in cross-section illustrating an alternative form of oven for producing BF gas from $BF_3$ feed gas.

Referring now to FIG. 3, this illustrates in cross-section an alternative form of oven for developing a fraction of BF gas from $BF_3$ feed gas. In FIG. 3, the oven is shown generally at 70, secured by an interface unit 71 to the wall 51 of the ion chamber of the ion source. Other features of the ion source are the same as in the FIG. 2 arrangement and no further detail is given in FIG. 3.

In FIG. 3, a cylindrical element 72 made of solid boron has a plurality of axial extending bores 73 extending along its length. A ceramic connection piece 74 is bonded between the external cylindrical surface of the element 72 near one end of the element and a ceramic feed tube 75. A ceramic washer 76 is bonded around the outer surface of the other end of the boron element 72 to provide annular sealing surfaces to provide a gas seal between the boron element 72 and the interface member 71. The interface member 71 is formed with a conical bore 77 leading to a feed bore 78 feeding through the wall 51 to the interior of the arc chamber. As in the FIG. 2 example, the gas seals between the graphite interface component 71 and the ceramic washer 76 on the one hand, and the chamber wall 51 on the other hand are improved by the provision of flexible graphite gaskets at 79 and 80.

The heating element 81 is formed wrapped around the tubular boron element 72, and heat shielding 82 is provided between the heating element 81 and an outer casing 83. In this example, the heat shielding 82 extends around the ceramic connector 74 as well as the boron element 72 with heating element 81.

The feed tube 75 extends through the casing 83 and feed-throughs 84 and 85 are also provided to take electrical conductors 86 and 87 respectively to the heating element 81 and a thermocouple 88 bonded to the boron element 72.

In operation, $BF_3$ gas from a source (not shown) is passed through the feed pipe 75 into the oven casing 83. The feed gas is distributed by the ceramic connector 74 so as to pass along the multiplicity of bores 73 through the boron element 72.

A heater supply (not shown) provides sufficient power to the heater element 81 to heat the boron element 72 to at least 1500° C. The heater supply and controller responsive to the thermocouple 88 may be similar to those described with reference to FIG. 2.

As the $BF_3$ gas passes over the internal surfaces of the bores through the boron element 72, the above-described reaction produces a fraction of BF gas, which emerges at the other end of the boron element to be passed along the tube 78 into the interior of the arc chamber. As before, the BF gas is more readily cracked and ionised to produce a higher proportion of $B^+$ ions.

The boron element 72 may be made from pure boron, or could alternatively be a sintered compact formed of boron or boron-rich powder.

The bores 73 along the boron element 72 may be typically 1 mm in diameter and should have rough internal surfaces to increase the contact area with $BF_3$ gas. Those external surfaces of the element which are required to make a good gas seal with other elements should be polished smooth.

In a simpler arrangement, a single tube of boron or boron-rich solid material may be fabricated having an inner diameter of 3–10 mm with a wall thickness of 2–4 mm for example. The tube is made sufficiently long so that a substantial length thereof may be heated to the temperature of about 1500° C. to promote the above-described reaction when $BF_3$ gas is passed along the tube.

Figure 4:
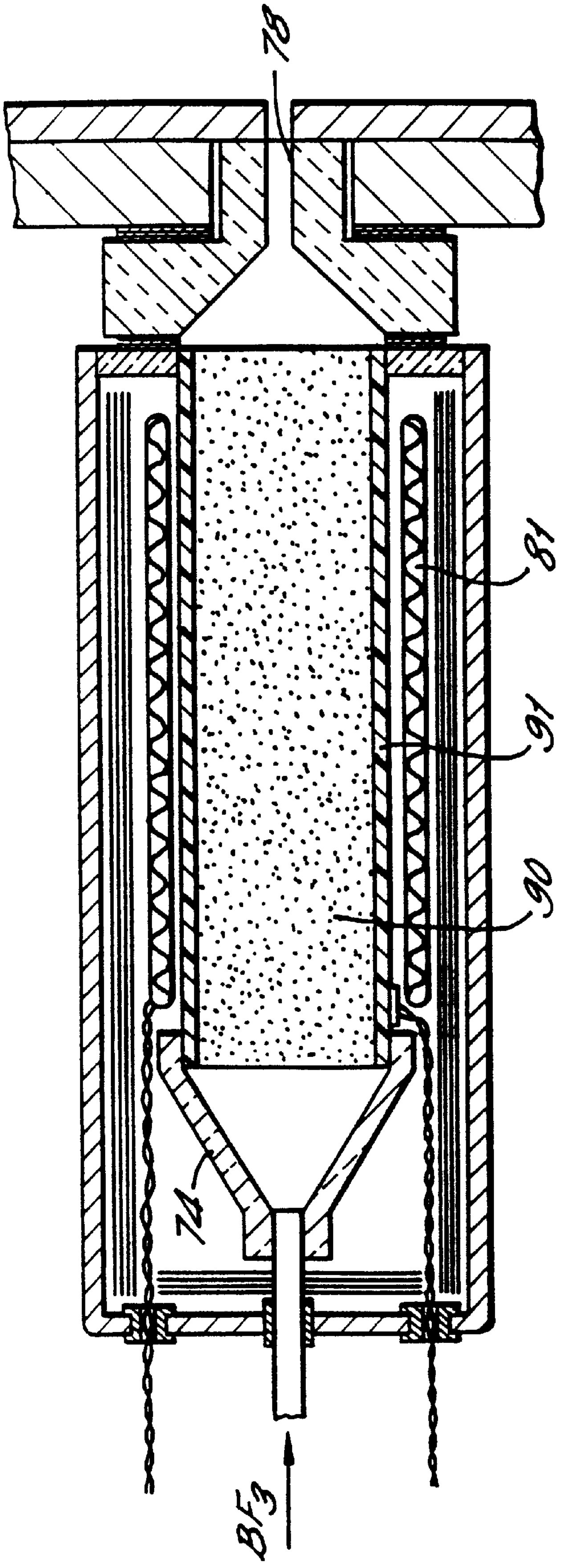
FIG. 4 is a schematic diagram of a still further embodiment of oven for producing BF gas.

FIG. 4 illustrates a further embodiment in which the boron element in the oven illustrated in FIG. 3 is replaced with a porous boron-rich member 90. Otherwise, the oven has the same features as described in connection with FIG. 3. In this arrangement, $BF_3$ gas is fed by the connector 74 to pass through the porous element 90, emerging at the opposite end to be collected and fed along bore 78 into the arc chamber. A coating of impervious material 91 is provided around the outer cylindrical surface of the porous boron 90. The member 90 is heated by a heating element 81 as before so that the reaction occurs producing BF gas.

Figure 5:
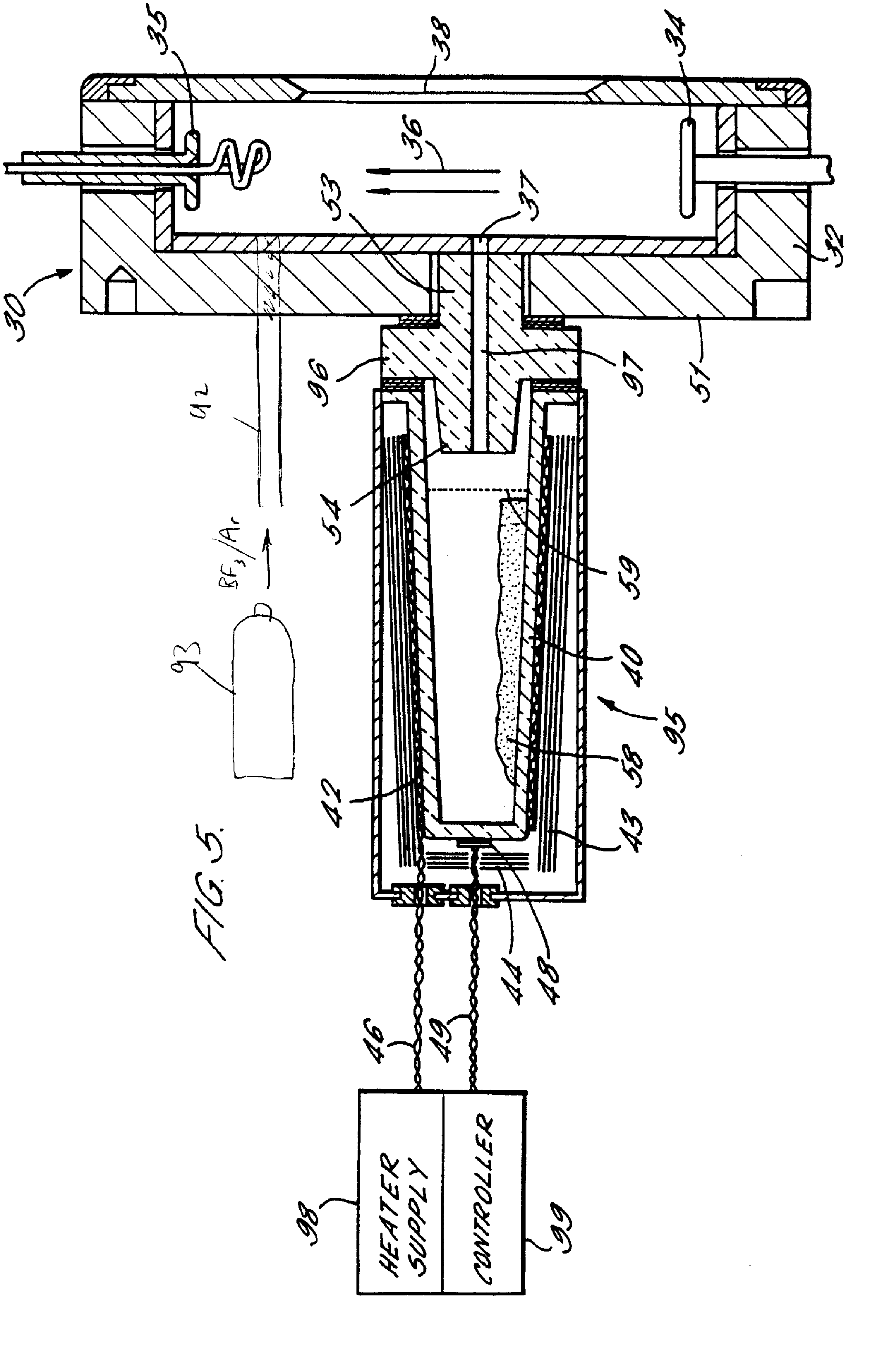
FIG. 5 is a schematic diagram in cross-section of an alternative modification of ion source for use in the implantation apparatus of FIG. 1, and incorporating an oven to generate boron vapour from solid boron.

FIG. 5 illustrates a further embodiment of the invention in which many features and parts of the illustrated apparatus are similar to those illustrated in FIG. 2 and are given the same reference numbers.

The ion source illustrated comprises an arc chamber 30 which is in substantially all respects identical to that in FIG. 2. An oven 95 is mounted on the wall 51 of the arc chamber in a similar manner to the oven 39 in the FIG. 2 embodiment. However, in the FIG. 5 embodiment, the graphite interface component 96 has only a single bore 97 extending from the face of the tapered nipple 54 of the component to the face of the parallel nipple 53 communicating with the inlet 37 into the arc chamber.

As in the FIG. 2 embodiment, the oven comprises a crucible 40, a surrounding heating element 42, heat shielding 43 and 44, and an outer casing 45. A heater supply 98 provides power along power cables 46 to the heating element 42 and the heater supply 98 is controlled by a controller 99 to maintain the temperature of the crucible at a desired value as sensed by a thermocouple 48 connected to the controller by wires 49.

The crucible 40 contains a mass of boron powder or granules 58 retained in the crucible by a grid 59.

In operation of the illustrated ion source, the heater supply 98 and controller 99 are arranged to maintain the temperature of the crucible at at least 1800° C. and preferably at a temperature of about 2000° C. At such temperatures, solid boron evaporates so that boron vapour is fed from the inside of the oven along the bore 97 through the interface component 96 to the arc chamber.

At a temperature of 2000° C., the partial pressure of boron vapour produced is in the region of $10^{-2}$ torr which is sufficient to sustain a plasma in the arc chamber. In FIG. 5, a stainless steel tube 92 provides a further gas inlet to the arc chamber 30 from a supply bottle 93 of reactive (e.g. $BF_3$) or inert (e.g. Ar) gas. In the case of $BF_3$ gas, a moderate partial pressure of this gas in addition to pure B vapour in the arc chamber can have several advantages. The plasma may be more easily sustained and controlled. Some of the $BF_3$ molecules in the plasma will be cracked into $B^+$ ions enhancing the current of these desired ions from the source. Also, highly reactive fluorine radials are formed which will react with any boron condensing on to the walls of the arc chamber, cleaning the walls and making the boron molecules available again for ionising in the plasma and extraction in the ion beam.

In the case of Argon gas, a moderate partial pressure of this gas in the arc chamber can substantially enhance the plasma energy and increase the sputter etching of any boron condensed on the arc chamber walls. Again this cleans the walls and returns the condensed boron molecules to the plasma.

Using an inert gas like Ar, the beam from the ion source will contain only $B^+$ ions with some $Ar^+$ ions, and the use of $BF_3$ gas is eliminated. This has significant advantages since $BF_3$ gas is toxic, corrosive and flammable. Avoiding the use of $BF_3$ gas can also prolong the life of the components of the ion source which in the prior art have to be replaced regularly due to the corrosion and contamination by fluorine atoms.

In constructing the oven illustrated in FIG. 5, it is desirable to use only one or a combination of the materials graphite, tungsten and tantalum so as to avoid the possibility of other contaminants in the beam line. In view of the high temperatures of the oven, good thermal shielding is required which may employ more than 6 tantalum foils, each about 0.2 mm thick. A water-cooling jacket may also be provided (not shown in FIG. 5) around the outer tantalum foil shield. It is important also to heat-shield the interface component 96 so that this can be as hot as possible to avoid condensation of boron vapour before this enters the arc chamber.

Instead of providing a separate gas feed to the arc chamber for the reactive or inert gas as illustrated in FIG. 5, an arrangement similar to that shown in FIG. 2 may be used, and the reactive or inert gas may be fed by the ceramic tube 62 through the interface unit 52 to the interior of the oven crucible 40. However, instead of the oven 39 heating the boron 58 to about 1500° C., the oven 39 is operated to heat to about 2000° C. to produce the required partial pressure of boron vapour to be fed with the feed gas through the bore 64 into the arc chamber.

It will be appreciated that the embodiments of the invention described employ ovens operating at relatively high temperatures, compared to those used in the prior art for vaporising phosphorus, arsenic or antimony for example. The high temperature ovens may incorporate design features known from those used in Molecular Beam Epitaxy, called effusion or Knudson cells.

Although the embodiments of the invention described above refer to a Bernas-type ion source, other ion source types, such as the Freeman source, may also be used. The method and arrangement for generating the plasma in the arc chamber of the ion source is not critical to the invention and all practical arrangements may be used.

What is claimed is:

1. An ion implantation apparatus including an ion source comprising an arc chamber, a source of feed gas to the arc chamber, and means to generate a plasma in the arc chamber, the plasma containing ions desired for implantation, the source of feed gas comprising a closed oven containing solid boron and operable to heat the solid boron to at least 1100° C., a source of $BF_3$ gas, an inlet connection to supply $BF_3$ gas from said source to said closed oven to contact the solid boron in the oven and an outlet connection to supply gas from the closed oven to the arc chamber, said outlet connection including a gas passage from the closed oven to the arc chamber.

2. Ion implantation apparatus as claimed in claim 1, wherein the oven is operable to heat the solid boron to a temperature in the range 1500 to 1800° C.

3. Ion implantation apparatus as claimed in claim 1, wherein the solid boron in the oven is in particulate form.

4. Ion implantation apparatus as claimed in claim 2, wherein the arc chamber has a feed gas inlet aperture and the oven comprises a generally tubular crucible which is open at one end containing said boron powder and an interface component to seal said open end of the crucible to said feed gas inlet aperture to provide said outlet connection of said source of feed gas, said inlet connection of said source of feed gas comprising a tube of refractory material feeding through the interface component from outside the oven and the arc chamber and extending inside the crucible to the closed end thereof.

5. Ion implantation apparatus as claimed in claim 1, wherein the solid boron is in rigid form at least partially lining the interior of the oven.

6. Ion implantation apparatus as claimed in claim 5, wherein the oven has an internal lining formed of solid boron.

7. Ion implantation apparatus as claimed in claim 6, wherein the arc chamber has a feed gas inlet aperture and the oven comprises a tubular element formed of solid boron, a heater to heat the tubular element, said inlet connection of said source of feed gas providing a gas-tight connection to one of said tubular element, and an interface component to seal the other end of the tubular element to said feed gas inlet aperture into the arc chamber to provide said outlet connection of said source of feed gas.

8. Ion implantation apparatus as claimed in claim 7, wherein said tubular element comprises a plurality of passages in parallel.

9. Ion implantation apparatus as claimed in claim 1, wherein the solid boron is formed as a porous block having opposite ends and the inlet connection of said source of feed gas is arranged to delivery $BF_3$ gas to one end of the block and the outlet connection of said source of feed gas is arranged to supply gas from the other end of block.

10. Ion implantation apparatus as claimed in claim 5, wherein the solid boron is substantially pure boron in a self-supporting solid mass.

11. Ion implantation apparatus as claimed in claim 5, wherein the solid boron is held in a self-supporting solid mass by an inert binder.

12. A method of generating boron ions for implantation in an ion implantation apparatus, comprising heating a mass of solid boron in a closed oven to at least 1100° C., supplying $BF_3$ gas to the closed oven to contact the hot solid boron to react therewith to produce gas containing BF molecules, feeding the gas containing BF molecules from the closed oven along a gas passage to an arc chamber, generating a plasma in the arc chamber to dissociate and ionise the BF molecules to produce $B^+$ ions and extracting the ions from the arc chamber for implantation.

13. A method as claimed in claim 12, wherein the solid boron is heated to between 1500 and 1800° C.

14. An ion implantation apparatus including an ion source comprising an arc chamber, a source of feed gas for the arc chamber, and means to generate a plasma in the arc chamber, the plasma containing ions desired for implantation, the source of feed gas comprising a closed oven containing solid boron and operable to heat the solid boron to at least 1800° C. to produce boron vapour, an outlet connection to supply said boron vapour from the closed oven to the arc chamber, said outlet connection including a gas passage from the closed oven to the arc chamber, the arc chamber having walls at a temperature below 1800° C. so that boron vapour in the arc chamber may condense on to said walls, the apparatus including a source of reactive gas, and means to feed said reactive gas from said source of reactive gas to the arc chamber, said reactive gas being selected to react with boron molecules condensing on to the walls of the arc chamber.

15. An ion implantation apparatus as claimed in claim 14, wherein the oven is operable to heat the solid boron to between 2000 and 2200° C.

16. An ion implantation apparatus as claimed in claim 14, wherein the reactive gas is fluorine containing.

17. A method of generating boron ions for implantation in an ion implantation apparatus, comprising heating a mass of solid boron in a closed oven to at least 1800° C. to produce boron vapour at a vapour pressure sufficient to support a plasma, feeding the boron vapour from the closed oven along a gas passage to an arc chamber, generating a plasma in the arc chamber to produce $B^+$ ions, maintaining the walls of the arc chamber at below 1800° C. so that boron vapour may condense on to said walls, feeding a selected reactive gas to the arc chamber to react with boron molecules condensed on to said walls, and extracting $B^+$ ions from the arc chamber for implantation.

18. A method as claimed in claim 17, wherein the solid boron is heated to between 2000 and 2200° C.

19. A method as claimed in claim 17, wherein the reactive gas is fluorine containing.

20. A method of generating boron ions for implantation in an ion implantation apparatus which comprises an ion source having an arc chamber in which a plasma can be generated at a predetermined minimum pressure of gas or vapour within the arc chamber, the method comprising the steps of a) heating a mass of boron solid to a predetermined temperature at which a partial pressure of boron vapour is produced over the boron solid which is at least said predetermined minimum pressure, b) feeding said boron vapour at said partial pressure to the arc chamber of the ion source, c) generating a plasma in the arc chamber to produce $B^+$ ions, d) feeding a selected reactive gas to the arc chamber to react with boron molecules condensed on to the walls of the arc chamber, and e) extracting ions from the arc chamber for implantation.

21. An ion implantation apparatus including an ion source comprising an arc chamber, a source of feed gas for the arc chamber, and means to generate a plasma in the arc chamber, the plasma containing ions desired for implantation, the source of feed gas comprising a closed oven containing solid boron and operable to heat the solid boron to at least 1800° C. to produce boron vapour, an outlet connection to supply said boron vapour from the closed oven to the arc chamber, said outlet connection including a gas passage from the closed oven to the arc chamber, the arc chamber having walls at a temperature below 1800° C. so that boron vapour in the arc chamber may condense on to said walls, the apparatus including a source of inert gas, and means to feed said inert gas from said source of inert gas to the arc chamber, said inert gas being selected to increase sputter etching of said walls of the arc chamber to remove boron condensed thereon.

22. An ion implantation apparatus as claimed in claim 21, wherein the oven is operable to heat the solid boron to between 2000 and 2200° C.

23. An ion implantation apparatus as claimed in claim 21, wherein the inert gas is Argon.

24. A method of generating boron ions for implantation in an ion implantation apparatus, comprising heating a mass of solid boron in a closed oven to at least 1800° C. to produce boron vapour at a vapour pressure sufficient to support a plasma, feeding the boron vapour from the closed oven along a gas passage to an arc chamber, generating a plasma in the arc chamber to produce $B^+$ ions, maintaining the walls of the arc chamber at below 1800° C. so that boron vapour may condense on to said walls, feeding a selected inert gas to the arc chamber to increase sputter etching of said walls of the arc chamber to remove condensed boron thereon.

25. A method as claimed in claim 24, wherein the solid boron is heated to between 2000 and 2200° C.

26. A method as claimed in claim 24, wherein the inert gas is Argon.

27. A method of generating boron ions for implantation in an ion implantation apparatus which comprises an ion source having an arc chamber in which a plasma can be generated at a predetermined minimum pressure of gas or vapour within the arc chamber, the method comprising the steps of a) heating a mass of boron solid to a predetermined temperature at which a partial pressure of boron vapour is produced over the boron solid which is at least said predetermined minimum pressure, b) feeding said boron vapour at said partial pressure to the arc chamber of the ion source, c) generating a plasma in the arc chamber to produce $B^+$ ions, d) feeding an inert gas to the arc chamber to increase sputter etching of the walls of the arc chamber to remove condensed boron thereon, and e) extracting ions from the arc chamber for implantation.

* * * * *